(12) United States Patent
Dolkemeyer et al.

(10) Patent No.: US 10,389,081 B2
(45) Date of Patent: Aug. 20, 2019

(54) SYSTEM AND METHOD FOR MODULATING LASER PULSES

(71) Applicants: AMPHOS GMBH, Herzogenrath (DE); AMOTRONICS UG, Aachen (DE)

(72) Inventors: Jan Dolkemeyer, Herzogenrath (DE); Claus Schnitzler, Herzogenrath (DE); Torsten Mans, Herzogenrath (DE); Stefan Verse, Aachen (DE); Martin Hessing, Aachen (DE); Jürgen Martini, Aachen (DE)

(73) Assignees: AMPHOS GMBH, Herzogenrath (DE); AMOTRONICS UG, Aachen (DE)

( * ) Notice: Subject to any disclaimer, the term of this patent is extended or adjusted under 35 U.S.C. 154(b) by 0 days.

(21) Appl. No.: 15/504,508

(22) PCT Filed: Aug. 17, 2015

(86) PCT No.: PCT/DE2015/100341
§ 371 (c)(1),
(2) Date: Feb. 16, 2017

(87) PCT Pub. No.: WO2016/026484
PCT Pub. Date: Feb. 25, 2016

(65) Prior Publication Data
US 2017/0237221 A1 Aug. 17, 2017

(30) Foreign Application Priority Data
Aug. 18, 2014 (DE) ........................ 10 2014 111 774

(51) Int. Cl.
*H01S 3/107* (2006.01)
*H01S 3/11* (2006.01)
(Continued)

(52) U.S. Cl.
CPC ............ *H01S 3/107* (2013.01); *H01S 3/0085* (2013.01); *H01S 3/11* (2013.01); *B23K 26/0624* (2015.10); *H01S 5/0085* (2013.01)

(58) Field of Classification Search
CPC .......... H01S 3/107; H01S 3/11; H01S 3/0085; H01S 5/0085; B23K 26/0624
See application file for complete search history.

(56) References Cited

U.S. PATENT DOCUMENTS 3,783,406 A * 1/1974 Hook ...................... H01S 3/115
372/12
7,307,362 B1 * 12/2007 Yampolsky ............ H03K 3/021
307/108
(Continued)

FOREIGN PATENT DOCUMENTS

| EP | 1384293 | 1/2004 |
| EP | 2775619 | 9/2014 |

(Continued)

OTHER PUBLICATIONS

PCT, International Preliminary Report on Patentability, International Application No. PCT/DE2015/100341 (dated Feb. 24, 2016).
(Continued)

*Primary Examiner* — Xinning (Tom) Niu
(74) *Attorney, Agent, or Firm* — Thompson Hine LLP

(57) ABSTRACT

The present invention relates to a system for modulating laser pulses by means of an electro-optical modulator which is operated by means of a pulsed modulation voltage. A voltage converter mounted upstream of the modulator converts a pulsed modulated switching voltage at an output voltage level to the modulation voltage that is higher than the output voltage level. The invention further relates to a method for modulating laser pulses.

18 Claims, 4 Drawing Sheets

(51) Int. Cl.
*H01S 3/00* (2006.01)
*H01S 5/00* (2006.01)
*B23K 26/0622* (2014.01)

(56) References Cited

U.S. PATENT DOCUMENTS

| | | | |
|---|---|---|---|
| 2002/0101718 A1* | 8/2002 | Negishi | F28F 3/025 |
| | | | 361/699 |
| 2003/0007526 A1 | 1/2003 | Pontis et al. | |
| 2003/0156615 A1 | 8/2003 | Kennedy et al. | |
| 2004/0146075 A1 | 7/2004 | Kennedy et al. | |
| 2004/0264539 A1* | 12/2004 | Narayan | H01S 5/141 |
| | | | 372/92 |
| 2005/0047454 A1 | 3/2005 | Williamson, III | |
| 2005/0069007 A1 | 3/2005 | Kennedy et al. | |
| 2006/0045150 A1 | 3/2006 | Newman et al. | |
| 2009/0245301 A1 | 10/2009 | Peng et al. | |
| 2013/0313701 A1 | 11/2013 | Bergmann | |
| 2014/0285021 A1 | 9/2014 | Yamagishi et al. | |

FOREIGN PATENT DOCUMENTS

| | | |
|---|---|---|
| JP | S5293292 A | 8/1977 |
| JP | 2001144357 A | 5/2001 |
| WO | 02/082596 A2 | 10/2002 |
| WO | 02/082596 A3 | 10/2002 |

OTHER PUBLICATIONS

PCT, International Search Report, International Application No. PCT/DE2015/100341, 8 pages, dated Feb. 24, 2016.

\* cited by examiner

SYSTEM AND METHOD FOR MODULATING LASER PULSES

TECHNICAL FIELD

The invention relates to a system and a method for modulating laser pulses with an electro-optical modulator which is operated by means of a pulsed modulation voltage.

BACKGROUND

Systems of this type and the corresponding methods find application primarily in the field of material processing by means of laser radiation, for example in the context of removal or modification processes in the printing industry, when perforating films and other industrial processes. However, various applications are also found in metrology and fundamental research. In these cases, a pulsed laser beam is provided by means of the laser, the individual pulses of said laser beam having to be modulated in accordance with the requirements of the respective application.

Specifically, depending on the application for which the laser is used, it may be necessary that the intensity of one or more laser pulses must be varied. Moreover, it may be the case that only certain laser pulses are intended to be directed out of the system. For this purpose, it is known for the laser pulses provided by the laser to be modulated or conditioned in accordance with the respective application by means of a modulator arranged in the beam path of the laser.

As modulators, in general electro-optical modulators such as Pockels cells are provided, for example, to which an electrical modulation voltage is applied on the input side and which enable on the output side an optical modulation of the laser pulses in phase, polarization and/or intensity.

In order to be able to modulate individual or a plurality of laser pulses in a targeted manner in accordance with a corresponding modulation stipulation, it is necessary for the modulation voltage also to be pulsed. Furthermore, the modulation voltage is usually at a comparatively high voltage level that is mostly even in the high voltage range (HV) which can result in problems particularly when generating very short modulation pulses of the modulation voltage. This is because the modulation voltage is generally provided as a continuous voltage by a high voltage source and is converted into a pulsed voltage by the actuation of a high voltage switch connected downstream, in accordance with the modulation stipulation.

What is problematic about such known systems, however, is that, particularly in the case of short switching times, said systems have overall a complex construction, and the switching times also cannot be reduced arbitrarily owing to the structural conditions of the high voltage switches.

This has proved to be disadvantageous particularly in the modulation of laser pulses in ultra-short pulse laser systems such as, for instance, Femtosecond lasers having high repetition rates. The reason for this is that, in a manner governed by the system, the high voltage switches require a certain switching time to switch a voltage from a first voltage level to a second voltage level. Specifically, in ultra-short pulse laser systems, these switching times, also referred to as rise time, are often greater than the pause time between the individual laser pulses. As a result of the excessively lengthy rise times, incorrect modulations of individual or a plurality of laser pulses can therefore occur, which, in material processing, for example, can lead to undesired impairments of the processing result. Moreover, a pulse-accurate setting of each laser pulse during the processing process is not possible.

SUMMARY

Therefore, the aim of the present invention is to specify a system and also a method which make it possible, in a simple manner, to perform a modulation of laser pulses that has little susceptibility to errors even in ultra-short pulse laser systems.

In the case of a system of the type mentioned in the introduction, this problem is solved by means of a voltage converter connected upstream of the modulator, which voltage converter converts a pulsed switching voltage at an output voltage level into the modulation voltage, which is increased relative to the output voltage level.

In the case of such a system, a switching voltage can firstly be generated at a comparatively low output voltage level in accordance with the desired modulation stipulation and then be converted into the modulation voltage, which is increased relative to the output voltage level, by means of the voltage converter with maintenance of the pulse sequence generated at the output voltage level. The switching voltage can be switched in a simpler manner and with shorter switching times at the output voltage level. Since the pulse sequence of the switching voltage is maintained even after the conversion thereof by the voltage converter, short rise times result even at the higher voltage level of the modulation voltage. The risk of incorrect modulations even in ultra-short pulse laser systems is significantly reduced in this way.

In accordance with one advantageous configuration, the voltage converter is embodied as a transformer. By virtue of the embodiment as a transformer, a voltage converter can be realized in a simple manner. In a transformer, the primary- and secondary-side electrical circuits are galvanically isolated from one another, which is advantageous in particular in terms of safety aspects. Particularly preferably, the transformer can have a transformer core, as a result of which a higher efficiency can be achieved. Alternatively, the voltage converter can also be embodied as a boost converter, for example.

Advantageously, a pulse generator, in particular a modulating pulse generator, is connected upstream of the voltage converter. As a result of the pulse generator being connected upstream of the voltage converter, a pulsed switching voltage can already be generated at the output voltage level, which is preferably in the low voltage range. The use of low voltage components enables a cost-effective construction of the system.

A configuration in which the pulse generator is embodied as a switch, in particular as a semiconductor switch, is particularly advantageous. Particularly preferably, the switch is embodied as a transistor. The use of a semiconductor switch or a transistor makes it possible, in a simple manner, to realize a fast switch which can switch electrical voltages without mechanical movements. Mechanical wear effects and resultant impairments of the system can thus be avoided. Semiconductor switches or transistors have very short rise times, such that the fast switching required for the accurate modulation is possible. Possible transistor configurations may be bipolar transistors or field effect transistors, for example. However, the use of MOSFETs as pulse generators is particularly preferred.

In this context, it is furthermore advantageous if the pulse generator is embodied as a semiconductor half-bridge or semiconductor full-bridge. Particularly preferably, the semiconductor half-bridge or the semiconductor full-bridge can be configured as a transistor half-bridge or a transistor full-bridge. Such half- or full-bridges are distinguished by the fact that only relatively low switching losses occur during switching, thus resulting in an expedient efficiency. Moreover, short rise or switching times can be achieved.

A further advantageous configuration provides for a low voltage source to be connected upstream of the pulse generator. Feeding the pulse generator with a low voltage affords the advantage that low voltage components can be used. As a result, by comparison with the high voltage components normally used in the prior art, a safety advantage can be achieved since, for example, the risk of a flashover and indeed also the electromagnetic impairments can be reduced. Advantageously, the low voltage source has a voltage of between 10 V and 1000 V, particularly advantageously between 10 V and 250 V, but particularly preferably a voltage of approximately 100 V.

In a further configuration of the invention, it is proposed that the pulse generator is controllable by means of a control voltage generated by a control unit. By controlling the pulse generator by means of a control voltage, the switching voltage, which is preferably in the low voltage range, can be modulated in accordance with a modulation stipulation predefined for example by the type of a material processing process, for example by means of a predefined bit stream. In this regard, by means of the control voltage, a pulsed switching voltage can be generated in accordance with the modulation stipulations of the respective application, for example in material processing, and can then be converted to the required voltage level of the modulation voltage with maintenance of this modulation by means of the voltage converter. By means of the control voltage, the switching voltage can be set in particular in terms of amplitude and pulse duration.

In accordance with a further advantageous configuration of the invention, the maximum modulation voltage is in the range of between 800 V and 10 kV. Most electro-optical modulators and, in particular, Pockels cells can be operated reliably in this range. Preferably, the maximum modulation voltage is in the range of between 800 V and 5 kV, particularly preferably in the range of between 800 V and 3 kV.

A further advantageous configuration provides a laser which provides a pulsed laser beam which is passed through the electro-optical modulator. Advantageously, the pulses of the laser and the pulses of the modulation voltage are coordinated with one another. In order to be able to achieve a pulse-accurate modulation, it is particularly advantageous in this context if the laser signal which is used in the laser for generating the pulsed laser beam is matched with the control signal of the control unit in order to obtain the desired modulation of the laser pulses.

A configuration in which the rise times of the modulation voltage are less than half of the pause time between two laser pulses is particularly advantageous. The risk of possible incorrect modulations can be significantly reduced as a result since the pauses can readily be utilized for the switching processes. Advantageously, the rise time of the modulation voltage is less than one quarter of the pause time between two laser pulses, but particularly preferably less than one eighth of the pause time between two laser pulses.

A configuration which is advantageous from a design standpoint since overall it is very convenient in terms of assembly provides for the pulse generator, the voltage converter and the control unit to be combined, in particular spatially, to form a module. Functionally, too, a combination to form a module is conceivable. The module can form a self-contained structural and/or functional unit within the system. By combining the individual components to form a module, the outlay on assembly can be reduced. Moreover, the module can be arranged in a housing, for example, as a result of which the individual components can be protected against environmental influences or damage. Advantageously, the module comprising pulse generator, voltage converter and control unit can be connected via a high voltage line to the electro-optical modulator, which may not necessarily be part of the module.

An alternative configuration provides for the pulse generator and the control unit to be combined to form a first module and the voltage converter and the electro-optical modulator to be combined to form a second module. In this case, the two modules can be connected to one another via a low voltage line, which affords the advantage that there are lower safety risks and losses as a result of the transmission of a low voltage between the two modules.

In accordance with a further alternative configuration, the pulse generator, the voltage converter and the electro-optical modulator are combined to form a module. In the case of such a construction, only the control unit is arranged in a manner isolated from the module, for which reason only one signal line has to be arranged between the module and the control unit. This affords further advantages with regard to safety and likewise with regard to electromagnetic compatibility (EMC).

A further advantageous configuration of the system provides for the pulse generator and/or the voltage converter to be coolable by means of a heat sink, in particular by means of a liquid-cooled ceramic carrier. By cooling the pulse generator and/or the voltage converter, it is possible to dissipate heat loss arising as a result of losses and charge-reversal currents, for example, such that overheating and hence failure of the individual components do not occur. Advantageously, the laser cooling provided for the laser can be concomitantly used for cooling the pulse generator and/or the voltage converter, thus resulting in a simpler and cost-effective construction.

Advantageously, the heat sink encloses the pulse generator and/or the voltage converter. Such a configuration can ensure that the heat is dissipated over a large area and in a plurality of directions.

Alternatively or additionally, the heat sink may also be embodied as a plate through which liquid flows. This is advantageous particularly if the pulse generator comprises transistors. The latter can be mounted preferably horizontally on the cooling plate, such that a good heat dissipation can already be realized in just one direction.

Furthermore, in order to solve the problem mentioned above, in the case of a method of the type mentioned in the introduction it is proposed that a voltage converter connected upstream of the modulator converts a pulsed switching voltage at an output voltage level into the modulation voltage, which is increased relative to the output voltage level.

The advantages already explained in connection with the system are afforded here as well.

In this context, it is furthermore advantageous if a system having the features described above is used for carrying out the method, wherein the features of the system can be used individually or in combination.

In accordance with one advantageous development of the method, it is proposed that the amplitude of the modulation voltage is adapted by varying the amplitude of the switching voltage. By varying the amplitude of the switching voltage, which is preferably in the low voltage range, it is possible to realize a precise pulse-to-pulse variation of the switching voltage, as a result of which a precise pulse-to-pulse variation of the modulation voltage, which is preferably in the high voltage range, can also be made possible. This affords the advantage of a more accurate modulation of the laser pulses.

In accordance with a further configuration of the method, a laser signal used for generating a pulsed laser beam is synchronized with a control signal used for controlling the control unit, such that a pulse-accurate modulation of the laser pulses can be achieved by means of the modulation voltage.

Advantageously, pulse-accurate laser pulse modulation sequences are generated by means of the electro-optical modulator, as a result of which an accurate processing, measurement or the like is possible.

BRIEF DESCRIPTION OF THE DRAWINGS

Further advantages and details of a system according to the invention and also of a method according to the invention will be explained below with the aid of the accompanying drawings of exemplary embodiments, in which.

DETAILED DESCRIPTION

Firstly, a system 100 known from the prior art and the disadvantages associated therewith will be discussed with reference to the illustration in FIG. 1 and FIG. 2, before details of the system 100 according to the invention will then be discussed with reference to the illustrations in FIGS. 3 to 8.

Figure 1:
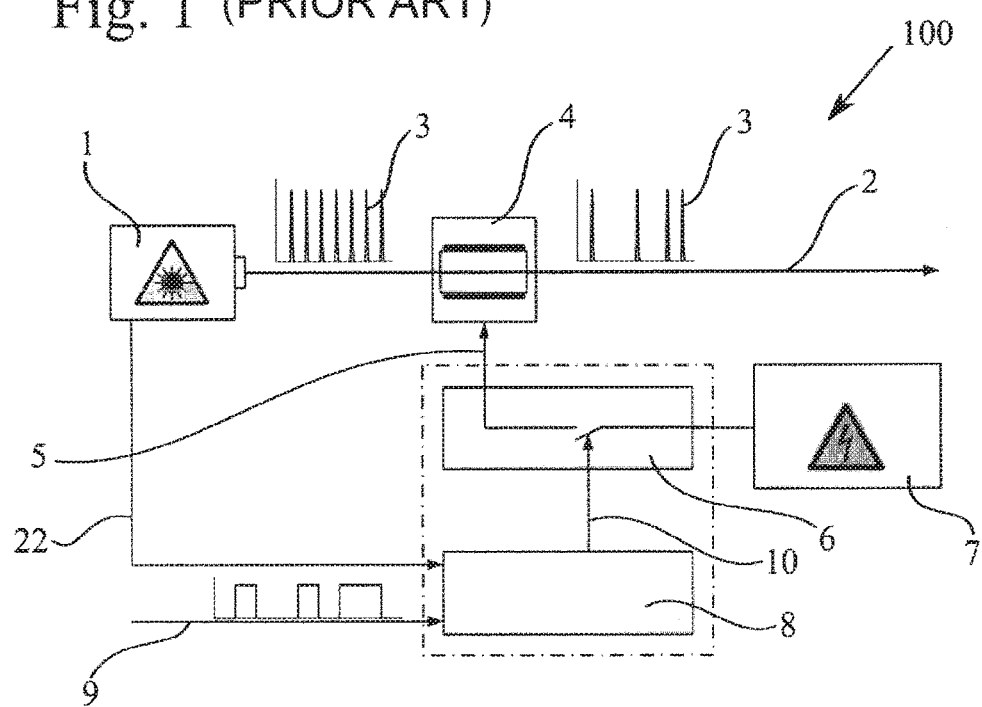
FIG. 1 shows a system in accordance with the prior art in a block diagram view.

FIG. 1 shows a construction, known from the prior art, of a system 100 comprising a laser 1 and an electro-optical modulator 4 connected downstream of the laser 1, which electro-optical modulator is intended to modulate the pulsed laser beam 2 generated by the laser 1 in accordance with specific modulation stipulations. Such systems 100 are often used in material processing, but also in metrology or fundamental research. This is because there it is necessary for a laser beam 2 provided in a pulsed manner to be modulated in accordance with the respective requirements of the application, where it is often necessary to modulate individual pulses 3 in a targeted manner.

Depending on the applications for which the pulsed laser beam 2 is intended to be used, it is necessary to modulate the laser pulses 3 in terms of their intensity and/or to direct individual laser pulses 3 out of the laser beam 2. For this modulation it is known to provide electro-optical modulators 4, such as Pockels cells, for example. These modulators 4 make it possible to modulate the laser pulses 3 in terms of their polarization, phase and intensity.

As can likewise be gathered from the illustration in FIG. 1, the electro-optical modulator 4 in known systems 100 is operated with a high voltage, in particular with a modulation voltage 5. In this case, the modulation voltage 5 is likewise pulsed, which is realized by means of a high voltage switch 6 in the prior art. The high voltage switch 6 is connected on the input side to a high voltage source 7 that can generate continuous voltages of 1000 V or more.

What is disadvantageous about the system 100 illustrated in FIG. 1, however, is that as a result of the use of the high voltage switch 6, fast switching is not possible on account of the rise times that are comparatively long in the case of such high voltage switches 6 in a manner governed by the system. Rather, such high voltage switches 6 are restricted to switching frequencies of usually 1 MHz.

Figure 2:
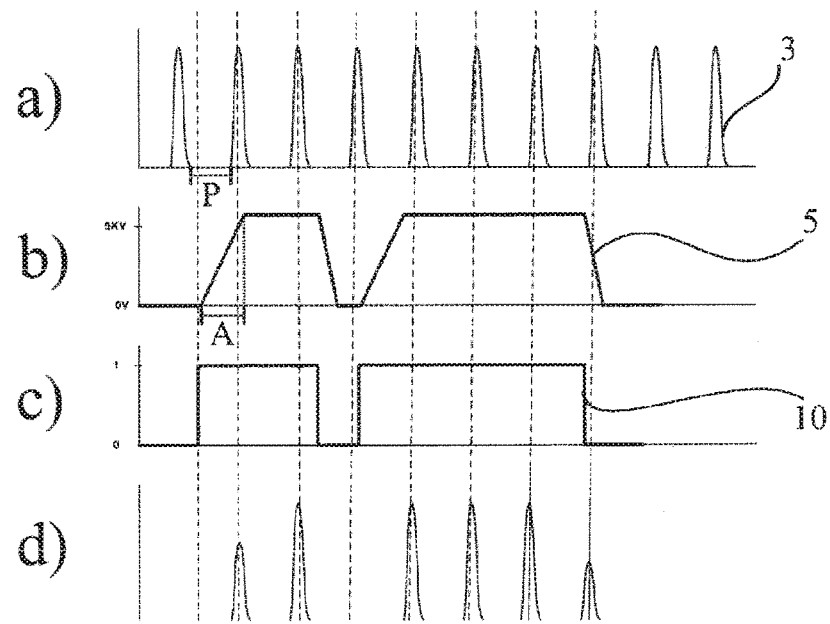
FIG. 2 shows graphs of the relationship between laser pulses, modulation voltage and control voltage in accordance with the prior art.

As is illustrated in FIG. 2, problems often occur, therefore, particularly when modulating laser beams 2 having rather short pulses. This is because the rise times A of the modulation voltage 5 in such cases are often greater than the pause time P between two laser pulses 3. The rise time A is the time in which the modulation voltage 5 rises from a first voltage value, here of 0 V, to a second voltage value, here 5 kV, in this respect cf. in particular FIGS. 2a) and 2b).

Although it is possible to accurately control the high voltage switch 6 by means of a control voltage 10 (cf. FIG. 2c), on account of the structural conditions the switch 6 is too sluggish to be able to likewise switch directly. Therefore, rise times A of greater than 25 ns until the required high-voltage modulation voltage 5 is reached are entirely customary in the field of high voltage switches 6. Incorrect modulations can consequently occur in which individual laser pulses 3 are undesirably varied or entirely cut off in terms of their intensity in accordance with the illustration in FIG. 2d). This can adversely influence for example the process for processing a workpiece in material processing.

This has proved to be particularly problematic when using ultra-short pulse laser systems, such as femto second lasers, for instance. This is because in that case the laser 1 generates a very highly repetitive laser beam 2 having pulse frequencies of up to 100 MHz or more. Such laser beams 2 can be modulated only very inadequately with the known systems. In order to obtain good results, it is necessary to provide switching frequencies of more than 1 MHz. In addition, a pulse-accurate variation of the modulation voltage 5 for each individual laser pulse 3 is also striven for, which cannot be realized with the known high voltage switches 6.

A system 100 according to the invention which solves these problems using simple means is illustrated in FIGS. 3 to 8 and will be explained in detail below.

In the case of the system 100 according to the invention, the modulator 4 is likewise situated in the beam path of the laser 1, which modulator is intended to modulate the laser pulses 3. However, in contrast to the system 100 illustrated in FIG. 1, a voltage converter 12 is connected upstream of the modulator 4, which voltage converter converts a pulsed switching voltage 13 at an output voltage level into the modulation voltage 5, which is increased relative to the output voltage level.

In the exemplary embodiment, the output voltage level of the switching voltage 13 is in the low voltage range and the voltage level of the modulation voltage 5 is in the high voltage range. The expressions low-voltage switching voltage (LV switching voltage) and high-voltage modulation voltage (HV modulation voltage) will be used hereinafter for the conceptual separation of the voltage levels. However, it should be pointed out that, according to the invention, configurations are also possible in which the modulation voltage 5 is likewise in the low voltage range, but is nevertheless significantly increased relative to the switching voltage 13.

By means of the voltage converter 12 connected upstream of the modulator 4, which voltage converter converts the switching voltage 13 in the low voltage range into the increased modulation voltage 5, which is preferably in the high voltage range, it is possible to generate already in the low voltage range a pulsed LV switching voltage 13 in accordance with the modulation stipulation, which is then converted into the HV modulation voltage 5 with maintenance of the pulse sequence with the aid of the high voltage converter 12.

In this exemplary embodiment, the voltage converter 12 is embodied as a transformer embodied as a high voltage converter, which transformer has a ferrite core 20 in order to improve its physical properties and in order to increase the efficiency. Moreover, it is possible to embody the transformer 12 as a circuit board transformer, the turns being embodied as a circuit board. On the primary side, the LV switching voltage 13 is applied to the transformer 12, wherein, by means of the transformer 12, the LV switching voltage 13 is then transformed into the HV modulation voltage 5 on the secondary side in accordance with a predefined turns ratio. Said modulation voltage is then applied to the modulator 4.

As has already been explained with regard to the prior art, a pulsed HV modulation voltage 5 adapted to the pulse sequence of the laser beam 2 has to be applied to the modulator 4. According to the invention, this pulsing is generated in the low voltage range. For this purpose, a pulse generator 6 is provided, which pulses the low voltage provided continuously by a low voltage source 11 in accordance with the modulation stipulations.

The low voltage source 11 is connected upstream of the pulse generator 6 and provides a voltage in the range of 10 V to 1000 V, but particularly preferably of 100 V. The use of a low voltage on the primary side of the transformer 12 makes it possible to use low voltage components. The latter are normally standard components which are available in large numbers and can therefore be procured in a simple manner. Moreover, the risk of a flashover and the electromagnetic loadings associated with the use of high voltage components are significantly lower. The greatest advantage of these components, however, is that very short rise times A may result.

Figure 5:
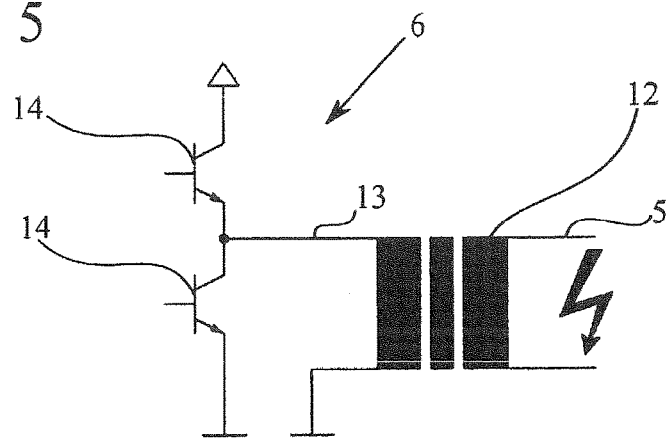
FIG. 5 is a schematic of a pulse generator according to an embodiment of the invention.
Figure 6:
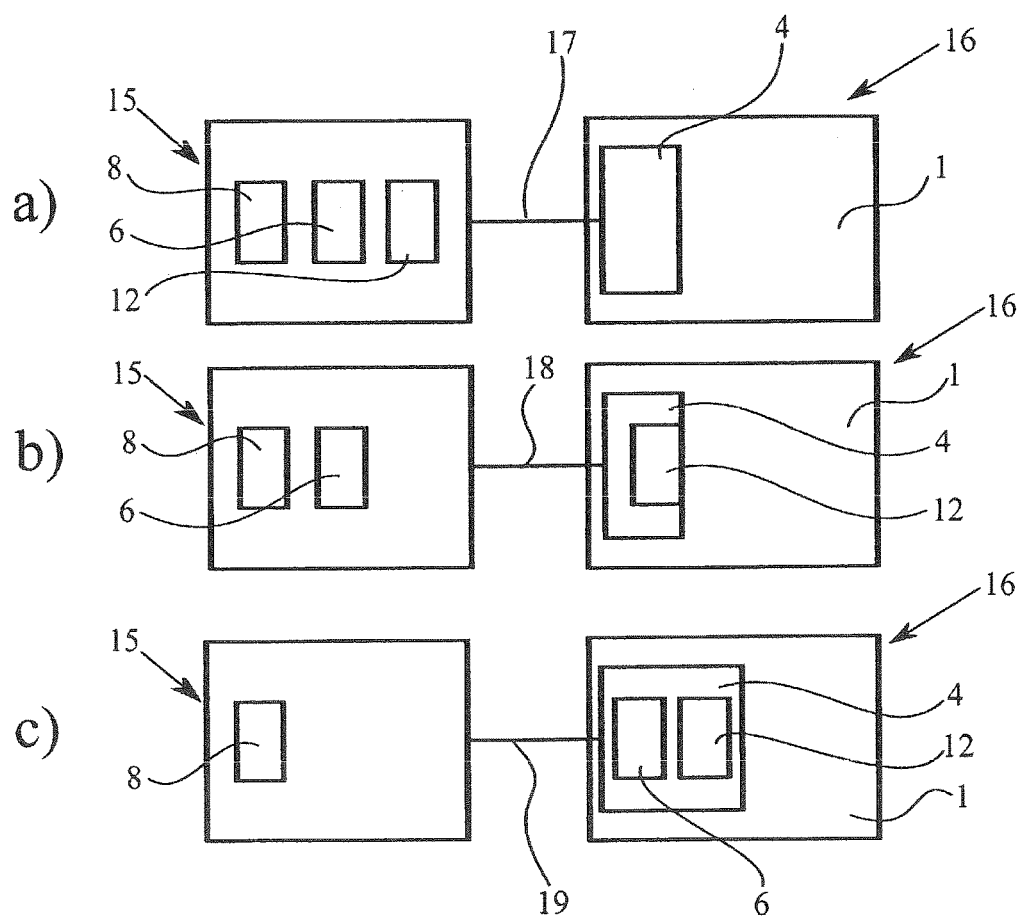
FIG. 6 shows schematics of various embodiment variants of a system according to the invention.

The pulse generator 6 is embodied as a switch which can switch the low voltage generated by the low voltage source 11 on and off depending on the modulation stipulation. In the present exemplary embodiment, the switching elements are embodied as a semiconductor or transistor cascade comprising individual semiconductor components 14, such as transistors, or comprising a plurality of parallel-connected semiconductor components 14 and are interconnected as a transistor half-bridge. FIG. 5 shows a schematic illustration of such a transistor half-bridge as a pulse generator 6. Alternatively, however, the use of a transistor full-bridge is also possible.

The use of transistors 14, and in particular of MOSFETs, affords the advantage of short rise times A, such that fast switching in the low voltage range is possible. Even with the use of ultra-short pulse laser systems, an accurate pulse-to-pulse modulation of the laser pulses 3 is therefore possible. By using transistor half- or full-bridges, lower switching losses occur during the switching between a first and second voltage. Moreover, the heat losses generated by high charge-reversal currents are kept low.

As can likewise be gathered from FIG. 5, the transistor cascade consisting of the two transistors 14 is connected on a primary side to the transformer 12, which converts the pulsed LV switching voltage 13 into the HV modulation voltage 5 on the secondary side.

Figure 3:
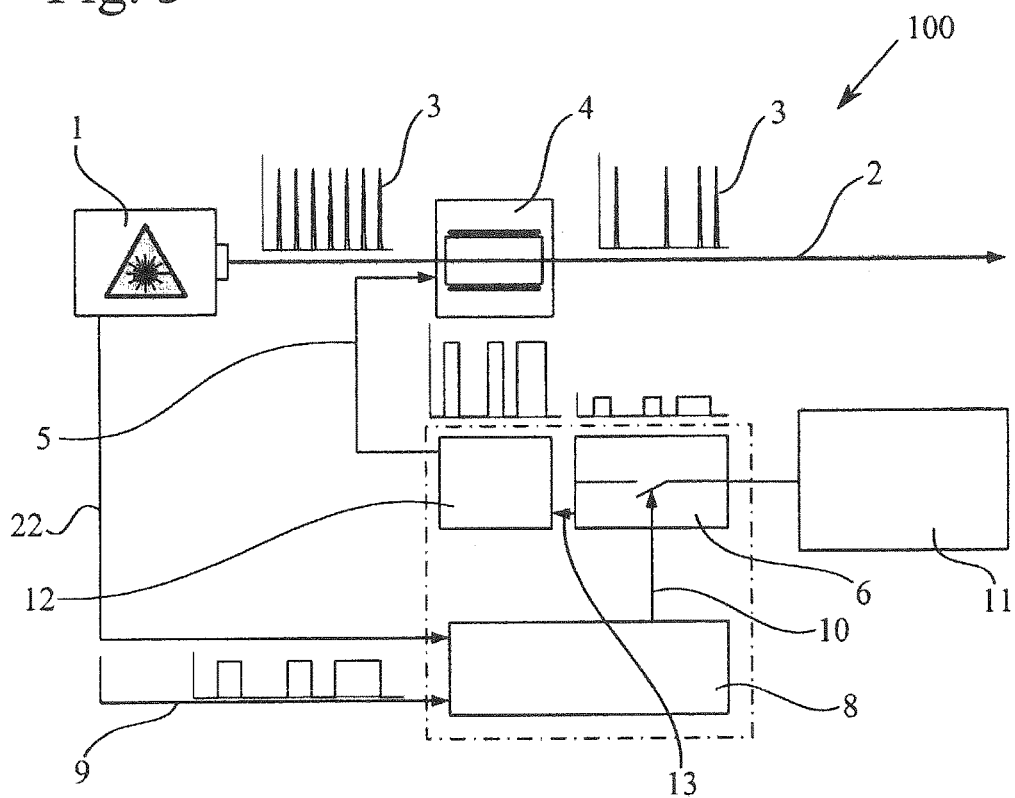
FIG. 3 shows a view, corresponding to the illustration in FIG. 1, of a system according to the invention.

In order that the pulse generator 6 can generate the pulsed LV switching voltage 13, it is necessary to apply a control voltage 10 to said pulse generator in accordance with the modulation stipulations, cf. FIG. 3. Therefore, the control voltage 10 is also pulsed in accordance with the modulation stipulations.

The control voltage 10 is provided by means of a control unit 8. The control unit 8 can be connected for example to a computer, or the like, from which a control signal 9, which may be a predefined bit stream, is transmitted to the control unit 8. The control signal 9 constitutes the actual modulation stipulation, which is also maintained by the control voltage 10, the switching voltage 13 through to the modulation voltage 5. The control voltage 10 is modulated with the aid of the control signal 9 and fed as switching stipulation to the pulse generator 6, such that the LV switching voltage 13 is pulsed in accordance with the modulation stipulation. The use of an LV pulse generator 6 affords the advantage that the control voltage 10 can be at a significantly lower voltage level than would be the case for example for the high voltage switch from the prior art. A simple and cost-effective construction therefore results.

Figure 4:
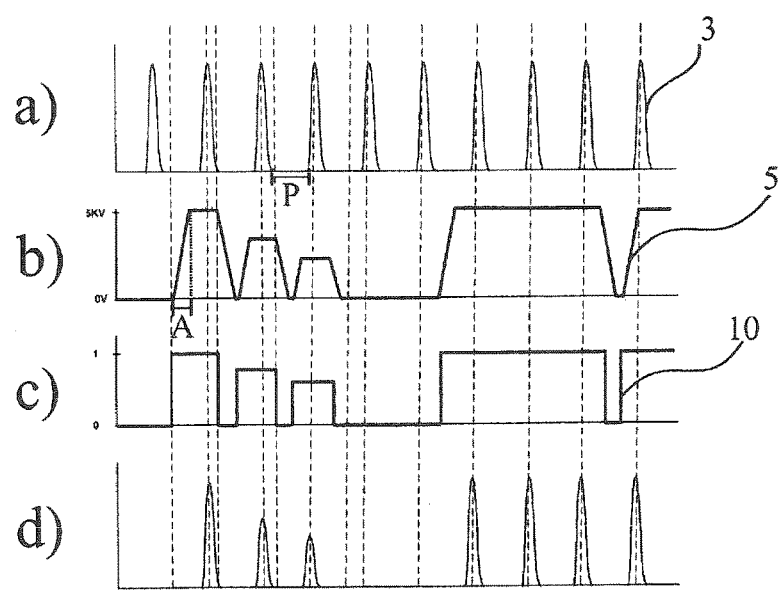
FIG. 4 shows a view, corresponding to the illustration in FIG. 2, of the laser pulses, of the modulation voltage and of the control voltage of a system according to an embodiment of the invention.

The afforded advantages of a system 100 according to the invention will now be explained in greater detail below with reference to the illustrations in FIG. 4. By virtue of the use of low voltage components, the rise times A of the HV modulation voltage 5 are significantly shortened by comparison with the prior art. In this regard, it is possible to achieve rise times A which are less than half of the pause time P between two pulses 3. In order then to be able to accurately modulate laser pulses 3 of ultra-short pulse laser systems, rise times A of less than P/2 are advantageous, but it is particularly advantageous if they are less than P/4 and in particular P/8. A corresponding illustration of the HV modulation voltage 5 of a system 100 according to the invention is shown in FIG. 4*b*).

Since the rise times A of the HV modulation voltage 5 are shorter than the pause time P between two laser pulses 3, incorrect modulations are prevented. For it is thus possible to accommodate the switching processes with a certain reliability or tolerance within the temporally longer pause time P. As a result, individual laser pulses 3 are no longer cut off undesirably or an undesired variation of the intensity of the laser pulses 3 no longer occurs. Incorrect modulations are reliably prevented. In this regard, it is possible for example to generate precise grey-scale bitmaps.

If the amplitude of the control voltage 10 and hence also the amplitude of the LV switching voltage 13 are varied, this also continues in the HV modulation voltage 5. As can be gathered from the illustration in FIG. 4*b*), the HV modulation voltage 5 can be reduced for example from a voltage value of 5 kV to 3 kV or 2 kV, which then leads in turn to a reduction of the intensity of the laser pulses 3, as is shown in FIG. 4*d*).

Furthermore, it is advantageous if a laser signal 22 used by the laser 1 for generating the pulsed laser beam 2 is synchronized with the control signal 9 or with the control voltage 10. This is because a temporal phase matching between the laser pulses 3 and the control signal 9 serving as modulation stipulation is thus possible in a simple manner. Complex variations of the individual phase angles are not required.

Possible module designs of the individual elements of the arrangement 100 will now be explained with reference to the illustrations in FIGS. 6a)-6c), wherein the term module hereinafter should be understood to mean spatial and/or functional units.

FIG. 6a) shows a system in which the high voltage converter 12, the pulse generator 6 and the control unit 8 are combined to form a module 15. The module 15 is connected via a high voltage line 17 to the laser 1, at which the modulator 4 is also arranged. The laser 1 and the modulator 4 likewise form a common module 16.

FIG. 6b) illustrates an embodiment in which the pulse generator 6 and the control unit 8 are combined to form a module 15. By contrast, the high voltage converter 12 is arranged at the modulator 4, thus resulting in a high voltage module 16. Since the high voltage conversion takes place only in the module 16, the module 15 can be connected to the module 16 via a low voltage line 18, for which reason the outlay for the cabling decreases here. This is results in an expedient division into an LV module 15 and an HV module 16.

FIG. 6c) shows a third embodiment variant, in which an LV module 15 and an HV module 16 are likewise provided. The pulse generator 6, the high voltage converter 12 and also the electro-optical modulator 4 are situated in the module 16. Therefore, it is only necessary to connect the control unit 8, which is arranged in the module 15, to the module 16 via a signal line 19, which further simplifies the construction of the system and in particular the cabling thereof.

By arranging individual or a plurality of components at the modulator 4 or at the laser 1, the line requirements between the individual modules 15, 16 are simplified. In this regard, a high voltage line 17 illustrated in FIG. 6a) or even a low voltage line 18 illustrated in FIG. 6b) can be dispensed with. The step from a high voltage line 17 to a low voltage line 18 is already highly advantageous since the risk of flashovers and indeed also the requirements made of the safety of such a system 100 can be reduced. As a result of the step from a low voltage line 18 to a signal line 19, the system 100 is simplified further and configured more cost-effectively. The EMC impairments are also significantly reduced further as a result.

Since heat loss arises on account of the high charge-reversal currents during pulse generation, but also during the transformation of the LV switching voltage 13, it is necessary to cool the pulse generator 6 and/or the high voltage converter 12. For this purpose, a heat sink 21, and in particular a liquid-cooled ceramic heat sink, is provided in accordance with the illustrations in FIGS. 7 and 8. Ceramic affords advantages since it does not impair the electrical properties of the system. By way of example, an aluminum nitrite ceramic has proven worthwhile as advantageous material.

Figure 7:
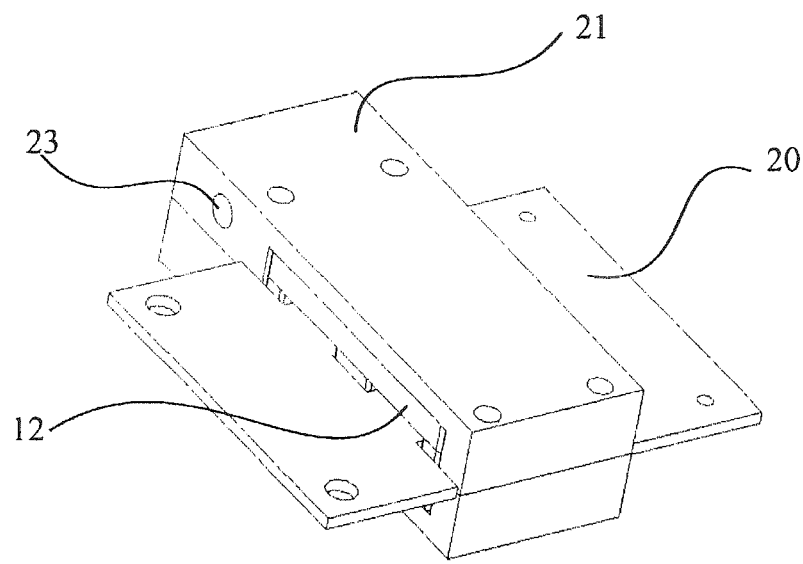
FIG. 7 is a perspective view of a high voltage converter with a first embodiment variant of a heat sink.

As can be gathered from the illustration in FIG. 7, a first embodiment provides for the transformer 12 to be situated in the interior of a yoke-shaped heat sink 21. The ferrite core 20 of the transformer 12 is arranged in the interior of said transformer. As can further be gathered from the illustration in FIG. 7, the heat sink 21 has openings 23 which enable water to pass through the heat sink 21. By virtue of the fact that the heat sink 21 completely encloses the transformer 12, it is possible to achieve a large-area heat dissipation in a plurality of directions. Consequently, an overheating of the components and thus also a failure of the system 100 do not occur.

Figure 8:
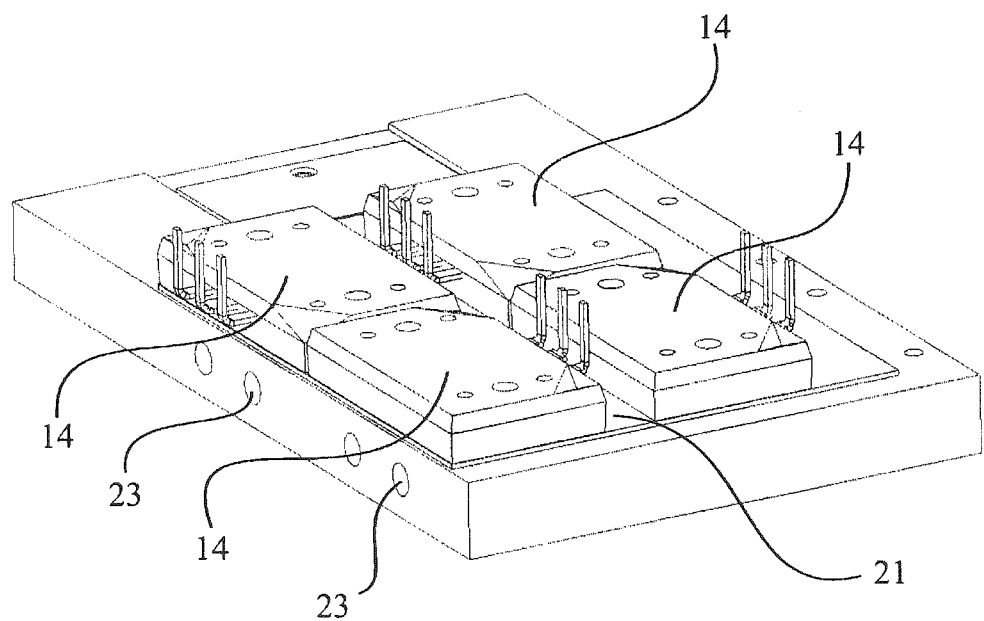
FIG. 8 is a perspective view of a pulse generator with a second embodiment variant of a heat sink.

FIG. 8 shows an alternative embodiment of the heat sink 21, in which the transistors 14 used as pulse generator 6 are arranged on a likewise liquid-cooled ceramic plate 21. As is shown by the illustration, the transistors 14 bear areally on the ceramic plate 21, such that a large area of the transistors 14 can be cooled. Here, too, the openings 23 serve for supplying water and discharging water. Such a configuration enables the heat dissipation to be effected downward.

If a cooling system is already provided at the laser 1 or at the modulator 4, said cooling system can also be used for cooling the high voltage converter 12 or the pulse generator 6. This results in a simple, cost-effective construction.

The system 100 described above, and also the corresponding method, are distinguished by the fact that it is possible to generate a pulsed switching voltage 13 at an output voltage level in the low voltage range, which switching voltage can then be converted, by means of a voltage converter 12, into the required modulation voltage 5, which is increased relative to the output voltage level, such that laser pulses 3 can be modulated in accordance with the modulation stipulations.

REFERENCE SIGNS

1 Laser
2 Laser beam
3 Laser pulse
4 Electro-optical modulator
5 Modulation voltage
6 Pulse generator
7 High voltage source
8 Control unit
9 Control signal
10 Control voltage
11 Low voltage source
12 Voltage converter
13 Switching voltage
14 Semiconductor component
15 Module
16 Module
17 High voltage line
18 Low voltage line
19 Signal line
20 Ferrite core
21 Heat sink
22 Laser signal
23 Opening
100 System
P Pause time
A Rise time

The invention claimed is:

1. A system for modulating laser pulses with an electro-optical modulator which is operated by means of a pulsed modulation voltage, the system comprising:
a voltage converter connected upstream of the modulator, which voltage converter converts a pulsed switching voltage at an output voltage level into the pulsed modulation voltage, which is increased relative to the output voltage level; and
a modulating pulse generator connected upstream of the voltage converter, wherein
the modulating pulse generator is controllable by a control voltage generated by a control unit, a laser signal used for generating laser pulses is synchronized with a control signal used for controlling the control unit, and rise times of the pulsed modulation voltage are accommodated within the temporally longer pause time between two laser pulses.

2. The system as claimed in claim 1, wherein the voltage converter includes a transformer.

3. The system as claimed in claim 1, wherein the modulating pulse generator includes a semiconductor switch.

4. The system as claimed in claim 1, wherein the modulating pulse generator is selected from a semiconductor half-bridge and a semiconductor full-bridge.

5. The system as claimed in claim 1, further comprising a low voltage source connected upstream of the pulse generator.

6. The system as claimed in claim 1, wherein the pulsed modulation voltage is between approximately 800 V and approximately 10 kV.

7. The system as claimed in claim 1, further comprising a laser which provides a pulsed laser beam which is passed through the electro-optical modulator.

8. The system as claimed in claim 7, wherein rise times of the modulation voltage are less than half of the pause time between the two laser pulses.

9. The system as claimed in claim 1, wherein the pulse generator, the voltage converter, and the control unit are spatially combined to form a module.

10. The system as claimed in claim 1, wherein the pulse generator and the control unit form a first module combined with the electro-optical modulator as a second module.

11. The system as claimed in claim 1, wherein the pulse generator, the voltage converter, and the electro-optical modulator form a module.

12. The system as claimed in claim 1, wherein the pulse generator and/or the voltage converter is cooled by a liquid-cooled ceramic carrier.

13. The system as claimed in claim 12, wherein the heat sink encloses the pulse generator and/or the voltage converter.

14. The system as claimed in claim 12, wherein the heat sink includes a plate through which liquid flows.

15. A method for modulating laser pulses with an electro-optical modulator which is operated by means of a pulsed modulation voltage, the method comprising:

converting a pulsed switching voltage at an output voltage level into the modulation voltage, which is increased relative to the output voltage level, by a voltage converter connected upstream of the modulator and a modulating pulse generator connected upstream of the voltage converter;

controlling the modulating pulse generator by a control voltage generated by a control unit:

generating laser pulses with a laser signal synchronized with a control signal for controlling the control unit: and accommodating rise times of the pulsed modulation voltage within the temporally longer pause time between two laser pulses.

16. The method as claimed in claim 15, wherein the system as claimed in claim 1 performs the method.

17. The method as claimed in claim 15, further comprising adapting the amplitude of the modulation voltage by varying the amplitude of the switching voltage.

18. The method as claimed in claim 15, further comprising generating pulse-accurate laser pulse modulation sequences by the electro-optical modulator.

* * * * *